(12) United States Patent
Ishihara et al.

(10) Patent No.: US 6,874,515 B2
(45) Date of Patent: Apr. 5, 2005

(54) SUBSTRATE DUAL-SIDE PROCESSING APPARATUS

(75) Inventors: Akira Ishihara, Tosu (JP); Michiaki Matsushita, Koshi-Machi (JP); Yukihiko Sakata, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 370 days.

(21) Appl. No.: 10/131,041

(22) Filed: Apr. 25, 2002

(65) Prior Publication Data

US 2002/0157692 A1 Oct. 31, 2002

(30) Foreign Application Priority Data

Apr. 25, 2001 (JP) ........................................ 2001-127146

(51) Int. Cl.⁷ ................................................ B08B 3/02
(52) U.S. Cl. ...................... 134/140; 134/148; 134/153; 134/902; 294/94
(58) Field of Search ................................ 134/137, 140, 134/148, 149, 153, 902; 294/93, 94; 194/93, 94

(56) References Cited

U.S. PATENT DOCUMENTS

| | | | | |
|---|---|---|---|---|
| 4,815,055 A | * | 3/1989 | Fago, Jr. ................... | 369/30.43 |
| 4,958,982 A | * | 9/1990 | Champet et al. .......... | 414/751.1 |
| 5,202,171 A | * | 4/1993 | Anezaki et al. ............ | 428/64.4 |
| 5,297,568 A | * | 3/1994 | Schmid ........................ | 134/62 |
| 5,474,641 A | * | 12/1995 | Otsuki et al. ................ | 438/694 |
| 5,485,644 A | * | 1/1996 | Shinbara et al. ............. | 15/21.1 |
| 5,498,294 A | | 3/1996 | Matsushita et al. | |
| 5,518,542 A | | 5/1996 | Matsukawa et al. | |
| 5,520,501 A | * | 5/1996 | Kouno et al. ................ | 414/741 |
| 5,686,143 A | | 11/1997 | Matsukawa et al. | |
| 5,824,153 A | * | 10/1998 | Suda et al. .................. | 117/208 |
| 5,964,954 A | | 10/1999 | Matsukawa et al. | |
| 6,258,220 B1 | * | 7/2001 | Dordi et al. ................. | 204/198 |
| 6,261,160 B1 | * | 7/2001 | Hakomori ..................... | 451/66 |
| 6,454,517 B1 | * | 9/2002 | Ohno .......................... | 414/783 |
| 6,578,891 B1 | * | 6/2003 | Suzuki et al. .............. | 294/64.1 |

FOREIGN PATENT DOCUMENTS

| | | | |
|---|---|---|---|
| DE | 196 41 534 | * | 4/1998 |
| JP | 63-39971 | * | 2/1986 |
| JP | 4-160161 | * | 6/1992 |
| JP | 10-46339 | * | 2/1998 |
| JP | 11-259946 | * | 9/1999 |

* cited by examiner

*Primary Examiner*—Frankie L. Stinson
(74) *Attorney, Agent, or Firm*—Smith, Gambrell & Russell, LLP

(57) ABSTRACT

A substrate dual-side processing apparatus has a processor to apply a specific process to a front surface and a rear surface of a substrate, a reversing unit to reverse the substrate and a substrate-transfer mechanism to transfer the substrate between the processor and the reversing unit. The reversing unit has a holder for holding the substrate when the substrate is being transferred to and from the substrate-transfer mechanism and a rotating mechanism for rotating the substrate, thus the substrate being reversed while held by the holders. The reversing unit may have a pair of holders for holding the substrate at the front and rear surfaces, a drive mechanism for driving the pair of holders so that the holders become close to or apart from each other and a rotating mechanism for rotating the substrate, thus the substrate being reversed while held by the holders.

5 Claims, 13 Drawing Sheets

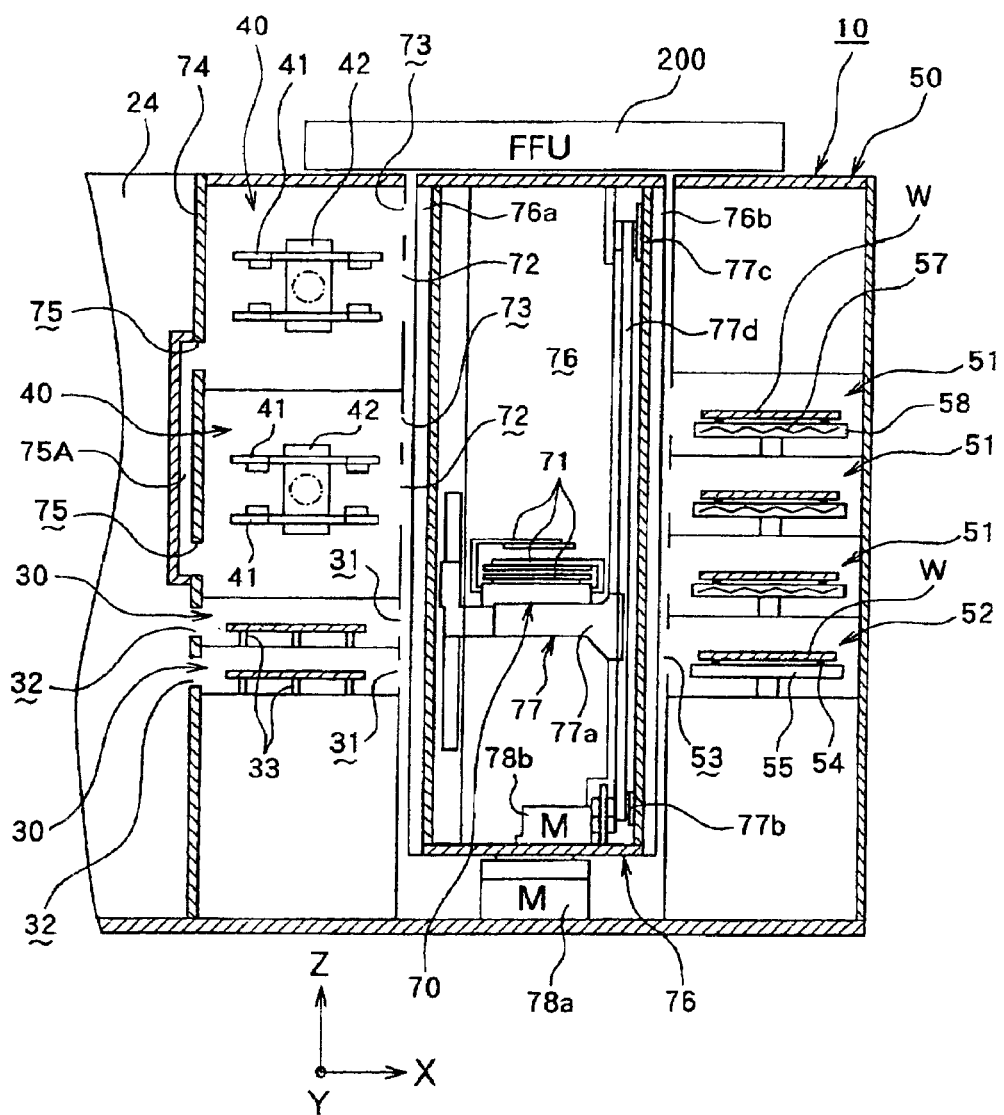
F I G. 4

SUBSTRATE DUAL-SIDE PROCESSING APPARATUS

BACKGROUND OF THE INVENTION

The present invention relates to an apparatus for processing substrates on both sides, or a substrate dual-side processing apparatus. Particularly, this invention relates to an apparatus for applying a specific process such as a cleaning process to substrates such as semiconductor wafers and LCD substrates on both sides.

A specific procedure such as a cleaning process is applied to semiconductor wafers, LCD substrates, etc., in semiconductor device fabrication. Particularly, the cleaning process is applied to wafers on both sides before and after several types of fabrication processes, for high cleanliness on the front surface of each wafer on which semiconductor devices will be formed.

A known substrate dual-side processing apparatus is a cleaning system equipped with a processor having several processing units for applying specific processes to wafers on both sides, a substrate transfer mechanism for transferring wafers to several processing units and a reversing unit for revering or turning over wafers.

As shown in FIG. 1, the reversing unit mainly consists of a substrate receiving/transferring mechanism 4 having a table 2 for receiving and transferring wafers W from and to a substrate transfer mechanism 1 and an elevator 3 for elevating the table 2, and a substrate-reversing mechanism 7 having a reversing arm 5 for receiving and transferring the wafers W from and to the substrate receiving/transferring mechanism 4 and a motor 6 for reversing each wafer held by the reversing arm 5.

In operation, on receiving a wafer W on the table 2 from the substrate transfer mechanism 1, the elevator 3 is driven to elevate the wafer W to the substrate reversing mechanism 7 located over the substrate receiving/transferring mechanism 4. The wafer W is gripped by the reversing arm 5 and reversed by the motor 6 for a specific process. It is then brought back to the substrate transfer mechanism 1 through a reverse action of the above and transferred to a cleaning unit.

The reversing unit, shown in FIF. 1 is, however, complex and large due to the existence of the substrate receiving/transferring mechanism 4 and the substrate reversing mechanism 7. Moreover, both mechanisms 4 and 7 operate separately, so that it takes time for a reversing operation, thus causing a low throughput.

Furthermore, the reversing unit could mishandle the wafer W between the substrate receiving/transferring mechanism 4 and the reversing arm 5. For example, the wafer W could be dropped if not accurately gripped by the reversing arm 5, thus being damaged.

SUMMARY OF THE INVENTION

Under consideration of the problems discussed above, a purpose of the present invention is to provide an apparatus for processing substrates on both sides, with a compact structure having less driving mechanisms for an accurate substrate revering operation, aiming at high throughput.

The present invention provides a substrate dual-side processing apparatus including: a processor to apply a specific process to a front surface and a rear surface of a substrate; a reversing unit to reverse the substrate; and a substrate-transfer mechanism to transfer the substrate between the processor and the reversing unit, wherein the reversing unit has a holder for holding the substrate when the substrate is being transferred to and from the substrate-transfer mechanism and a rotating mechanism for rotating the substrate, thus the substrate being reversed while held by the holders.

Moreover, the present invention provides a substrate dual-side processing apparatus including: a processor to apply a specific process to a front surface and a rear surface of a substrate; a reversing unit to reverse the substrate; and a substrate-transfer mechanism to transfer the substrate between the processor and the reversing unit, wherein the reversing unit has a pair of holders for holding the substrate at the front and rear surfaces, a drive mechanism for driving the pair of holders so that the holders become close to or apart from each other and a rotating mechanism for rotating the substrate, thus the substrate being reversed while held by the holders.

BRIEF DESCRIPTION OF DRAWINGS

FIG. 4 shows a schematic sectional view of a reversing unit, a wafer-transfer mechanism and processing units according to the present invention;

DETAILED DESCRIPTION OF PREFERRED EMBODIMENTS

Figure 1:
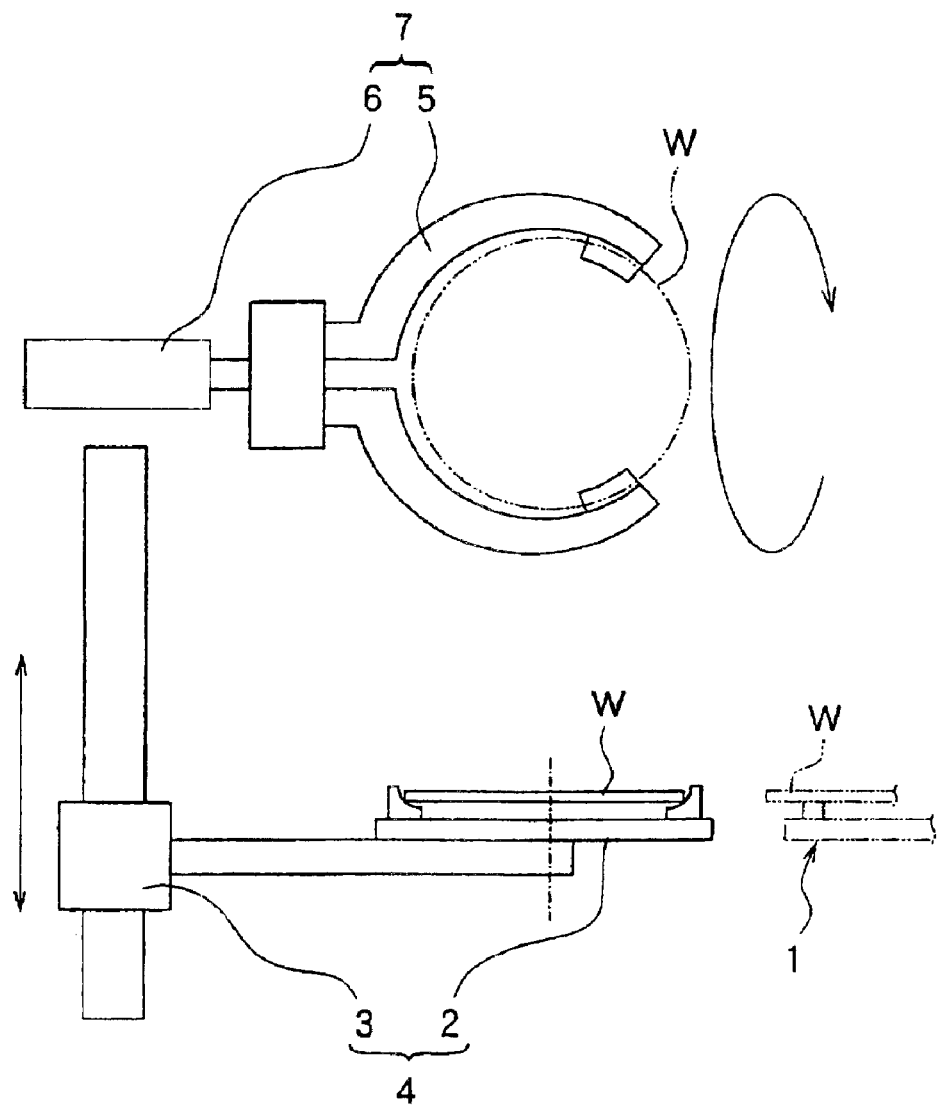
FIG. 1 shows a schematic side view of a well known reversing unit.

Preferred embodiments according to the present invention will be disclosed with reference to the attached drawings.

Disclosed below is an application of an apparatus for processing substrates on both sides to a cleaning system for sequential wafer transfer-in, cleaning, drying and transfer-out process.

The apparatus for processing substrates on both sides according to the present invention is termed a substrate dual-side processing apparatus hereinafter.

As shown in FIGS. 2 to 5, the cleaning system mainly consists of a cleaning section 10 for cleaning semiconductor wafers W as substrates to be processed and a transfer section 20 for transferring and receiving the wafers W to and from the cleaning section 10.

The transfer section 20 is equipped with a transfer unit 22 having a table 21 on which carriers C are arranged, a wafer transfer mechanism 23 for transferring the wafers W between the carries C and the cleaning section 10, and an interface unit 24 having a wafer transfer passage (not shown) for the wafer transfer mechanism 23. Each carrier C contains 26 wafers W for example.

Figure 2:
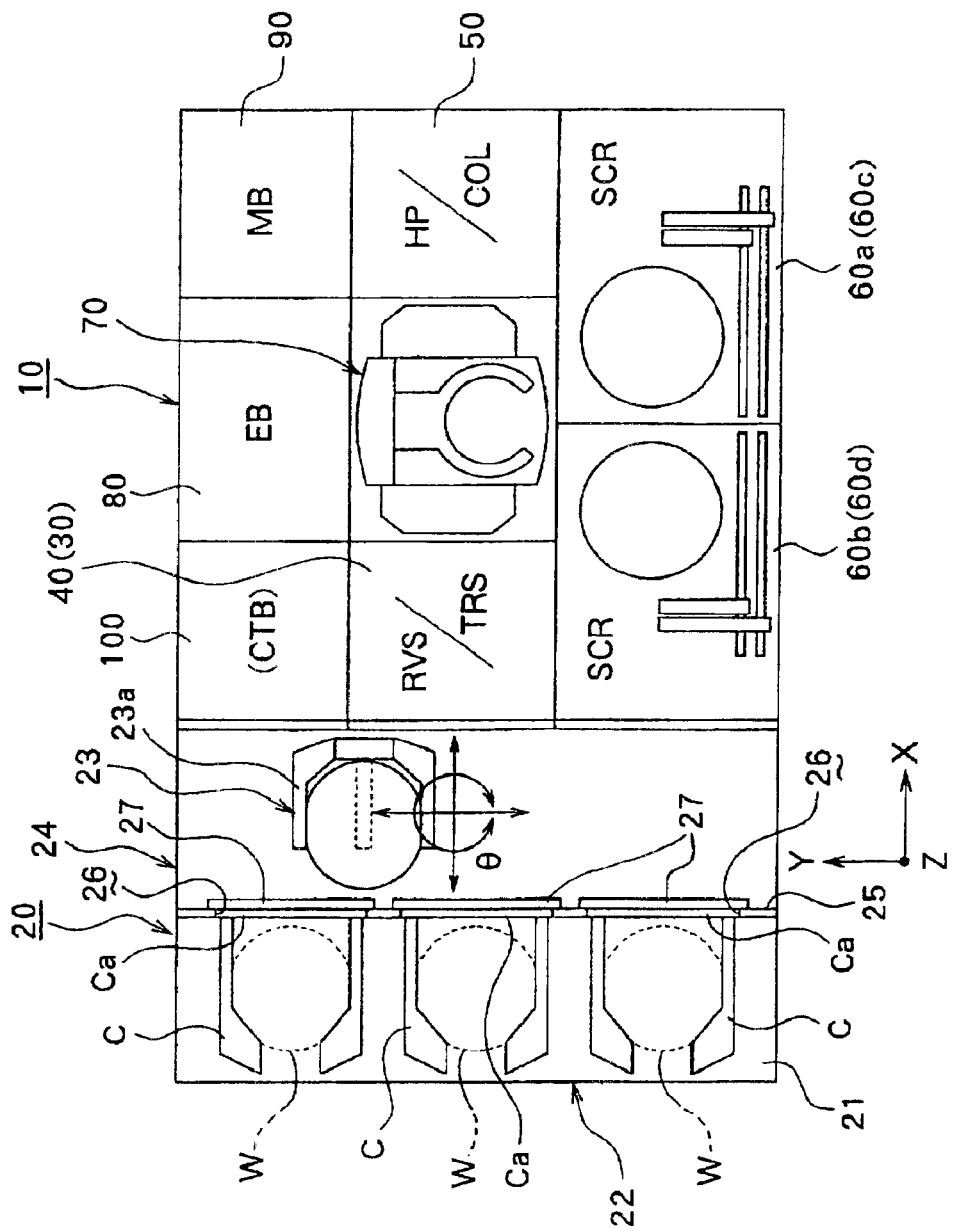
FIG. 2 shows a schematic plan view of a semiconductor cleaning system in which a substrate dual-side processing apparatus according to the present invention is installed.

In detail, as shown in FIG. 2, three carriers C, for example, are arranged on the table 21 in the direction Y. A window 26 is provided at a partition 25 for each carrier C. The partition 25 separates the transfer unit 22 and the interface unit 24. A window-shutting mechanism 27 such as a shutter is provided at the interface-unit side of each window 26, for opening and closing the window.

Several types are available for the carriers C, for example, each carrier C may be provided with a cover Ca for opening and closing an opening of the carrier through which wafers W are taken out and brought in. The window-shutting mechanism 27 can open the cover Ca of each of the carriers C arranged on the table 21 as facing the windows 26.

The wafer transfer mechanism 23 can access each carrier C for wafer transfer while the window 26 and the cover Ca are opened.

Each cover Ca may be opened manually by an operator when the carrier C is placed on the table 21 so that the wafers W can be transferred though the window 26 opened by the shutter. The cover Ca is, however, not a must, so that no cover-opening mechanism is necessary. The structure of the windows 26 is flexible in accordance with the structure of the carriers C.

The window-shutting mechanism 27 is equipped with a mapping sensor (not shown). The mapping sensor detects conditions of the wafers W contained in each carrier C, as to how many wafers W have been contained, whether the wafers W have been contained as sticking out forward or backward (the direction X) or whether they have been contained as obliquely in a height direction (the direction Z). A cleaning process will be applied to the wafers W after wafer conditions are detected by the mapping sensor for accurate processes.

The wafer transfer mechanism 23 provided on the interface unit 24 is movable to the direction Y for accessing each carrier C on the table 21. The mechanism 23 has a wafer-holding arm 23a movable to the direction X and rotatable in X-Y plane (the direction). The wafer-holding arm 23a takes out or brings back the wafers W from or to the carriers C through the windows 26. Moreover, the arm 23a can access a wafer-receiving unit (TRS) 30 provided in the cleaning section 10.

As disclosed, the wafer transfer mechanism 23 can transfer the wafers W from the transfer unit 22 to the cleaning section 10 and vice versa. Moreover, the wafer transfer mechanism 23 can elevate in the vertical direction Z for accessing the wafers W contained at any height in the carriers C.

The cleaning section 10 is equipped with a wafer-reversing (RVS) unit 40 for reversing the wafers W, the wafer-receiving unit (TRS) 30 for receiving and transferring the wafers W from and to the interface unit 24, and a heating/cooling (HP/COL) unit 50 for wafer drying after cleaning.

Also provided in the cleaning section 10 are scrub-cleaning (SCR) units 60a to 60d for applying scrub cleaning to the wafers W, and a main wafer-transfer mechanism 70 accessible to the wafer-receiving unit 30, the wafer-reversing unit 40, the heating/cooling (HP/COL) unit 50 and the cleaning units 60a to 60d.

The wafer-reversing unit 40 has a two-tiered structure. The wafer-receiving unit 30 placed under the wafer-reversing unit 40 also has a two-tiered structure. The scrub-cleaning units 60a to 60d also have a two-tiered structure. On the contrary, the heating/cooling unit 50 has a four-tiered structure.

Moreover, the cleaning section 10 is provided with electrical control (EB) unit 80 and a mechanical control (MB) unit 90 for controlling the entire operation of the cleaning system, and also a chemical tub (CTB) unit 100 for containing a cleaning liquid to be supplied to the scrub-cleaning units 60a to 60d.

Figure 5:
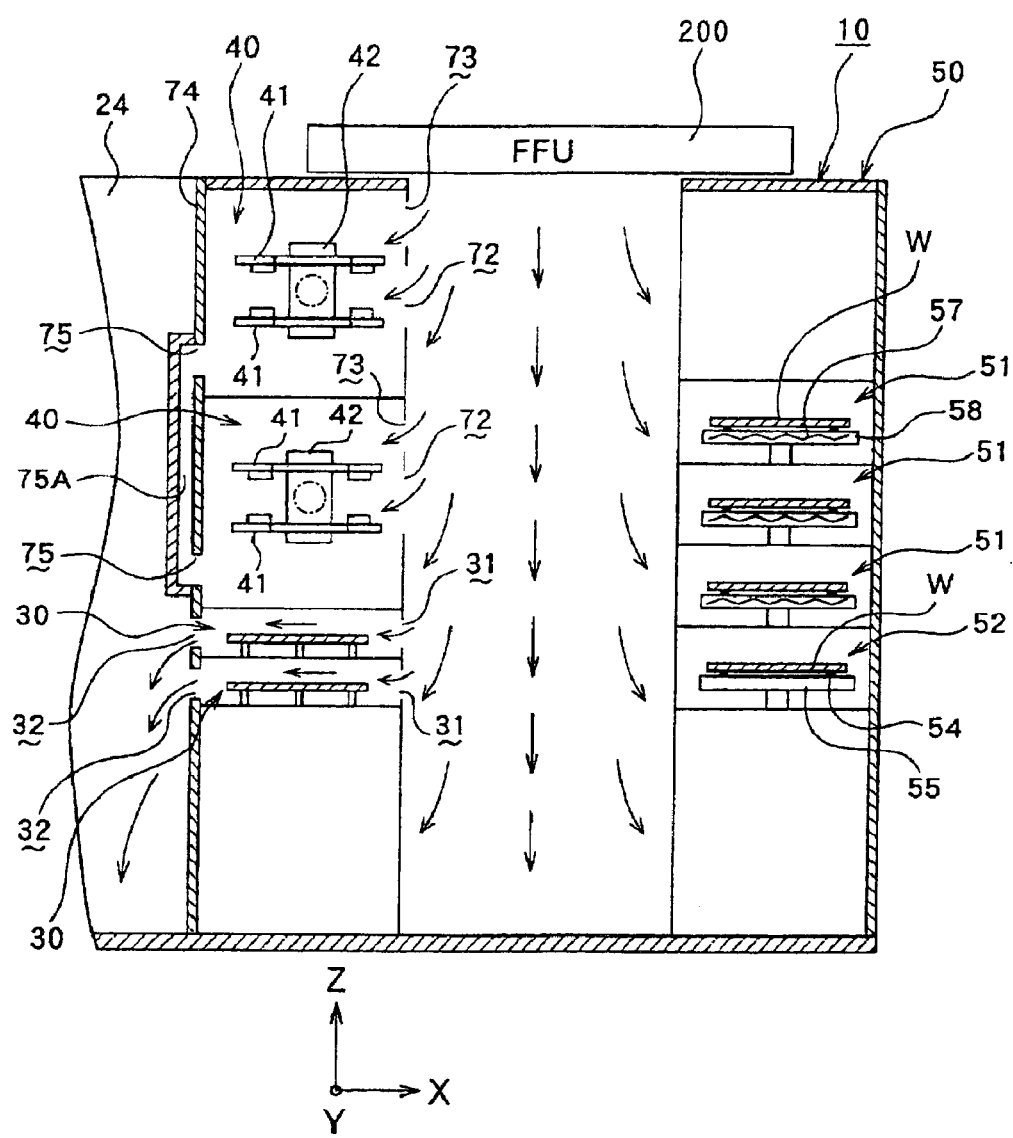
FIG. 5 shows air downflow from a filter fan unit to the reversing unit, the wafer-transfer mechanism and the processing units according to the present invention.

Provided on the cleaning section 10 is a filter fan unit (FFU) 200 for down flowing clean air to each wafer-processing unit and the main wafer-transfer mechanism 70 as shown in FIG. 5.

Figure 6:
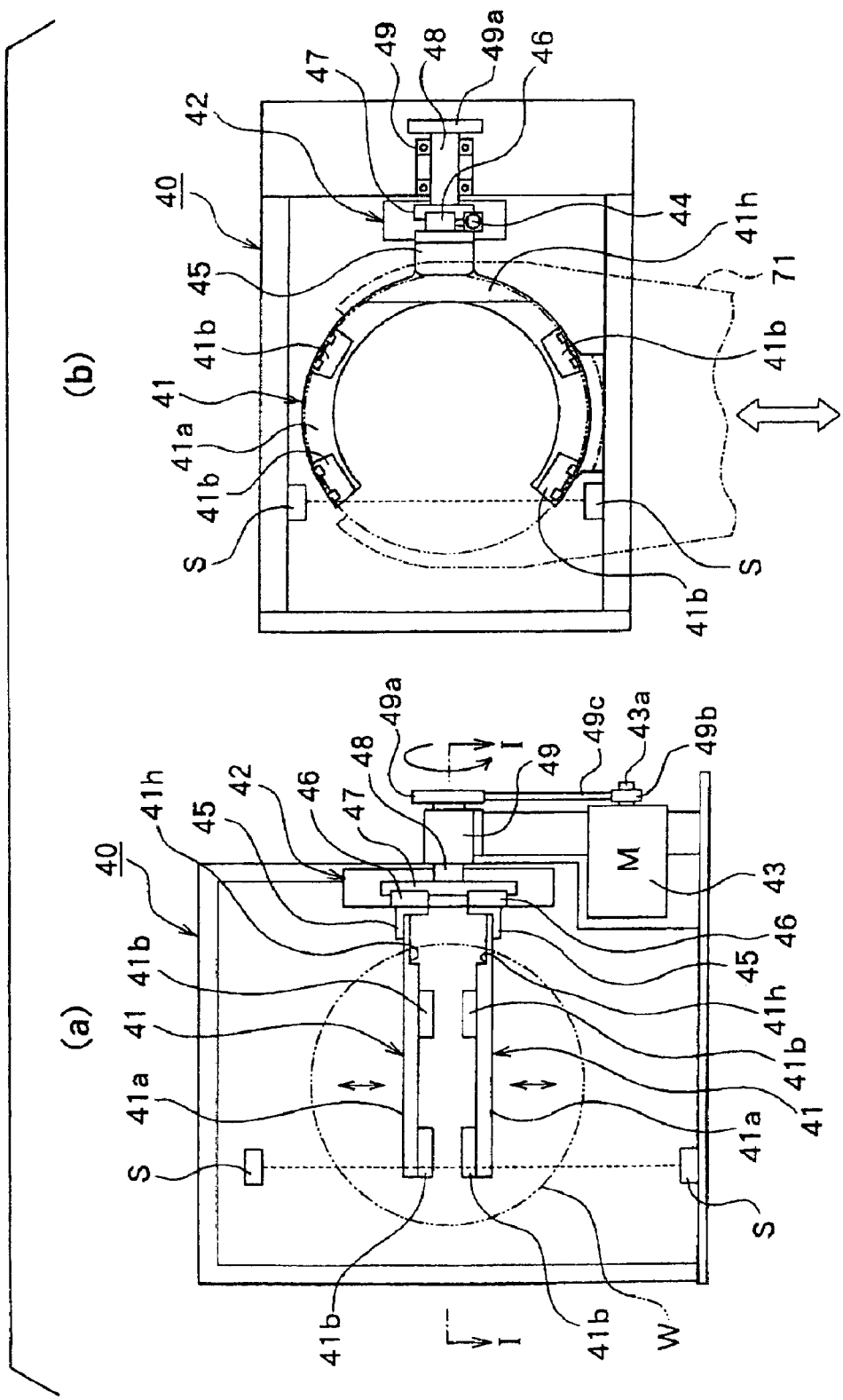
FIG. 6 shows a side view (a) of the reversing unit according to the present invention and another side view (b) of the reversing unit, taken on line I—I of the view (a)

As shown in FIG. 6, the wafer-reversing unit 40 is equipped with a pair of wafer-holing arms 41 as a holder for holding each wafer W at both sides, a driving mechanism 42 for moving the holing arms 41 in a tight contact while holding the wafer W or with a specific gap when not holding the wafer W, and a motor 43 as a rotating mechanism for rotating the holing arms 41 to reverse the wafer W.

Figure 7:
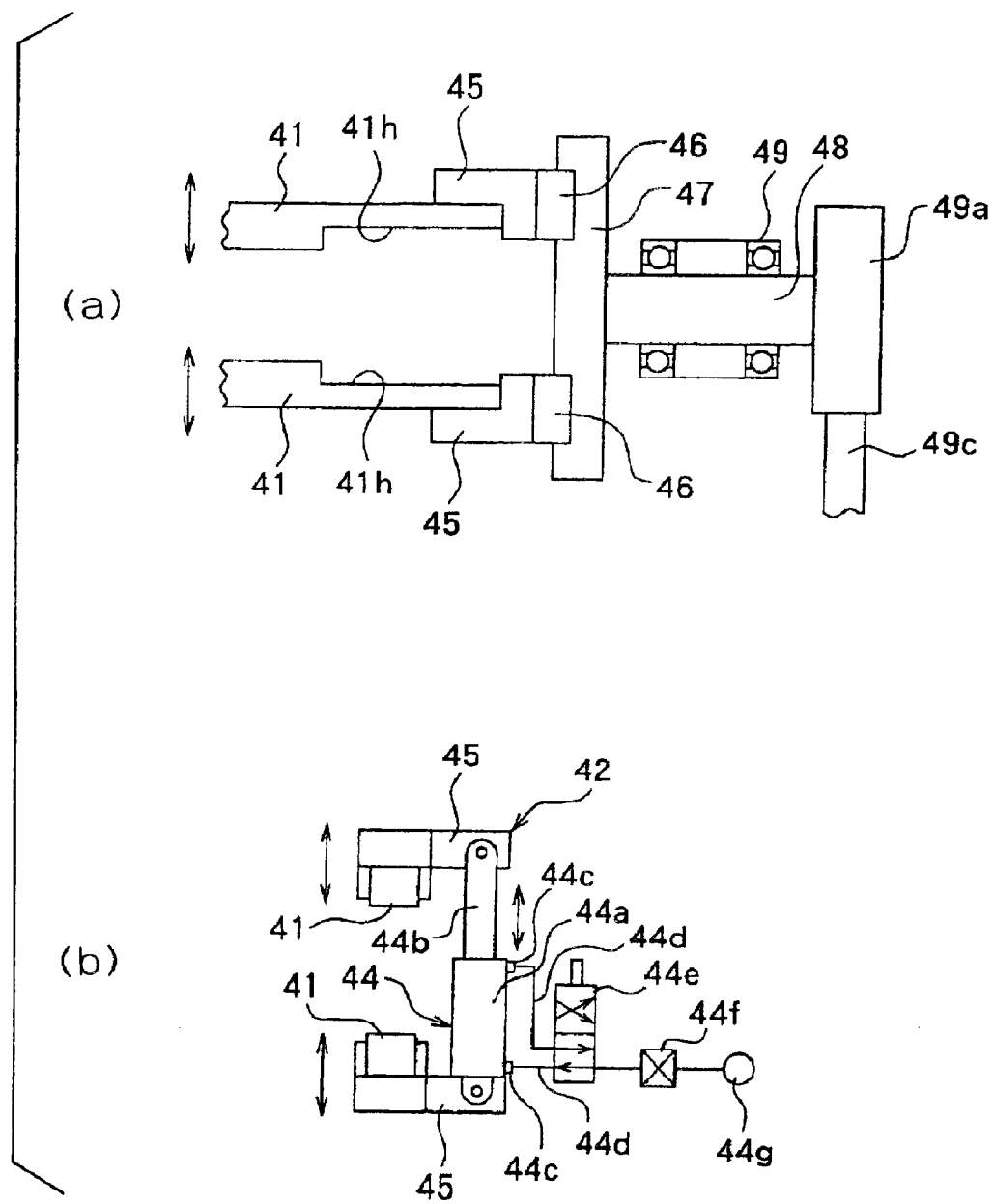
FIG. 7 shows a side view (a) illustrating that wafer-holding arms according to the present invention become close to or apart from each other and another side view (b) of a drive mechanism for driving the holding arms as illustrated in the view (a)

As shown in FIGS. 6 and 7, the driving mechanism 42 is equipped with an extendable cylinder 44 and chucks 45 for coupling the cylinder 44 on both ends to the holding arms 41. Slidable joints 46 attached to the chucks 45 are coupled to a linear guide 47 so that they are slidable along the linear guide. The extendable cylinder 44 is driven so that the holing arms 41 can hold each wafer W transferred into the wafer-reversing unit 40.

More in detail, as shown in FIG. 7(b), the extendable cylinder 44 is an air cylinder having a cylinder 44a and a plunger 44b. An air supplier 44g is connected to the air cylinder via a switching valve 44e and an open/close valve 44f provided along each supply and exhaust pipe 44c connected to one of ports 44c provided at the cylinder 44a at both ends. The movement of the chucks 45 in holding the wafers W is detected by a chuck-opening sensor and a chuck-closing sensor (both not shown).

A rotary shaft 48 joined to the linear guide 47 at the back center is horizontally supported by a bearing 49 so that it can rotate by a motor (M) 43 via a timing belt 49c that runs on a driven pulley 49a attached to the shaft 48 and a drive pulley 49b attached to a drive shaft 43a of the motor 43.

The motor 43 rotates the rotary shaft 48 and also the holding arms 41 at 180 degrees around the shaft 48 via the linear guide 47 to reverse wafers W.

An air actuator may be used instead of the motor 43, which can be directly coupled to the rotary shaft 48 with no belt and pulleys required.

Figure 8:
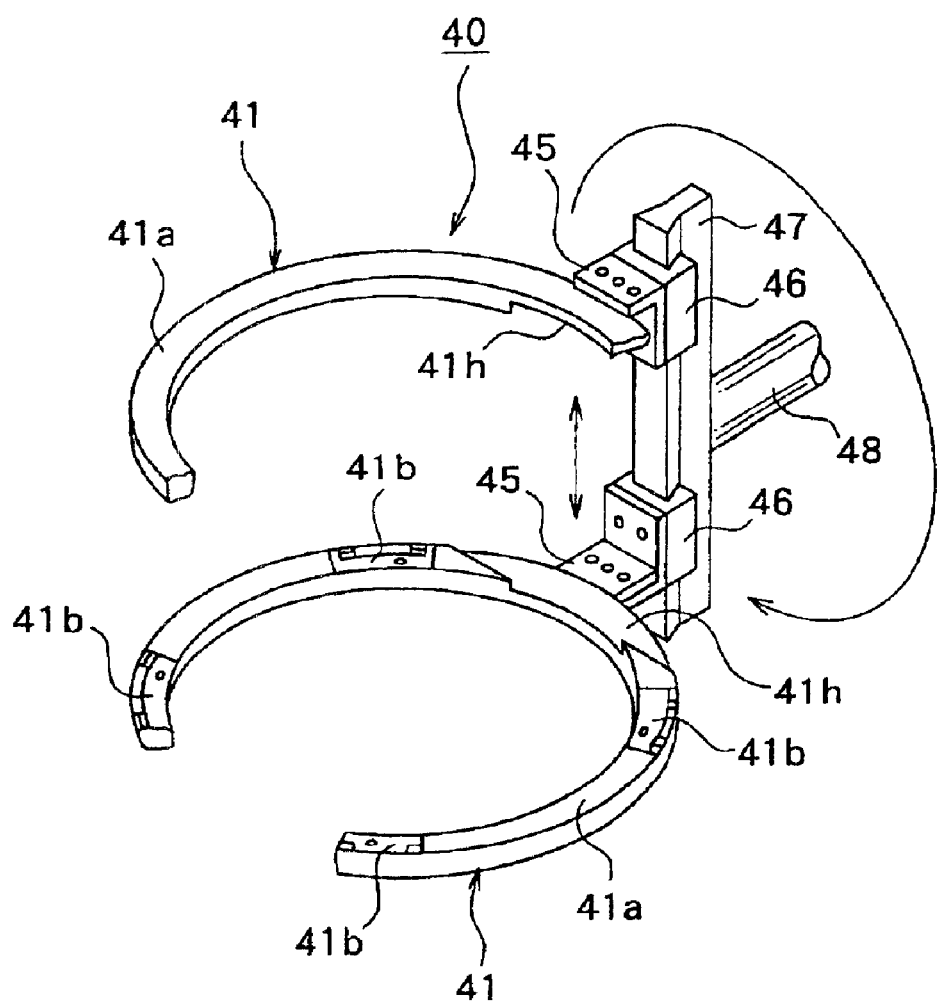
FIG. 8 shows a schematic perspective view of the wafer-holding arms according to the present invention.

As shown in FIGS. 6 and 8, each holding arm 41 is equipped with a horseshoe-like arm 41a and four supporters 41b fixed on the arm 41a symmetrically in relation to the axis of the rotary shaft 48. The supporters 41b are arranged as shown in FIG. 6(b) such that they are located within a movable area of the main wafer-transfer arm 71 of the main wafer-transfer mechanism 70. The arrangements protect the supporters 41b from interfering with the main wafer-transfer arm 71.

The horseshoe-like arm 41a is made of aluminum alloy etc., on the contrary, the supporters 41b are made of PCTFE (polychlorotrifluoroethylene).

Figure 9:
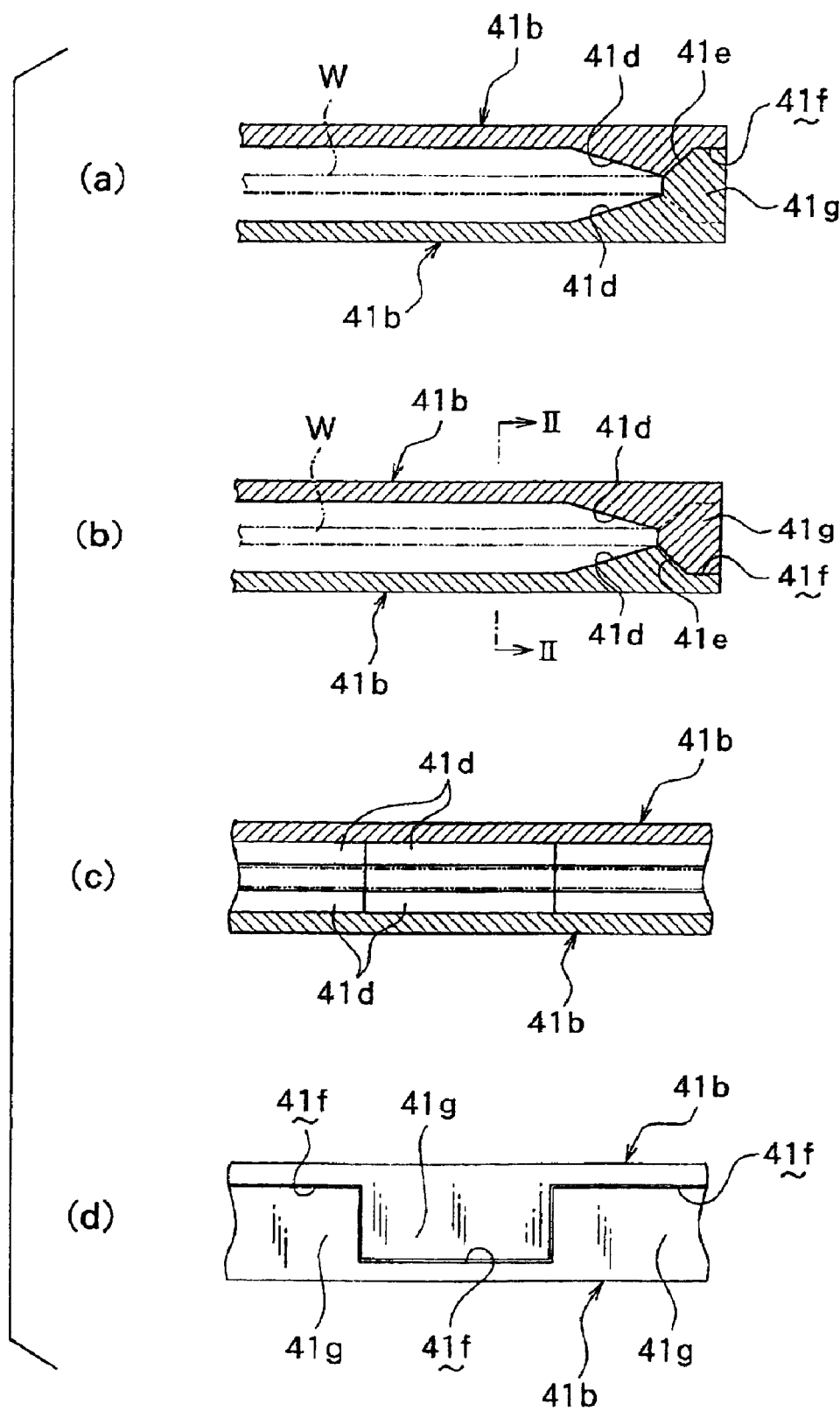
FIG. 9 shows side views (a) and (b) illustrating engagement of supporters according to the present invention in different situations, a side view (c) taken on line II—II of the view (b) and still another side view (d) illustrating engagement of the supporters.
Figure 10:
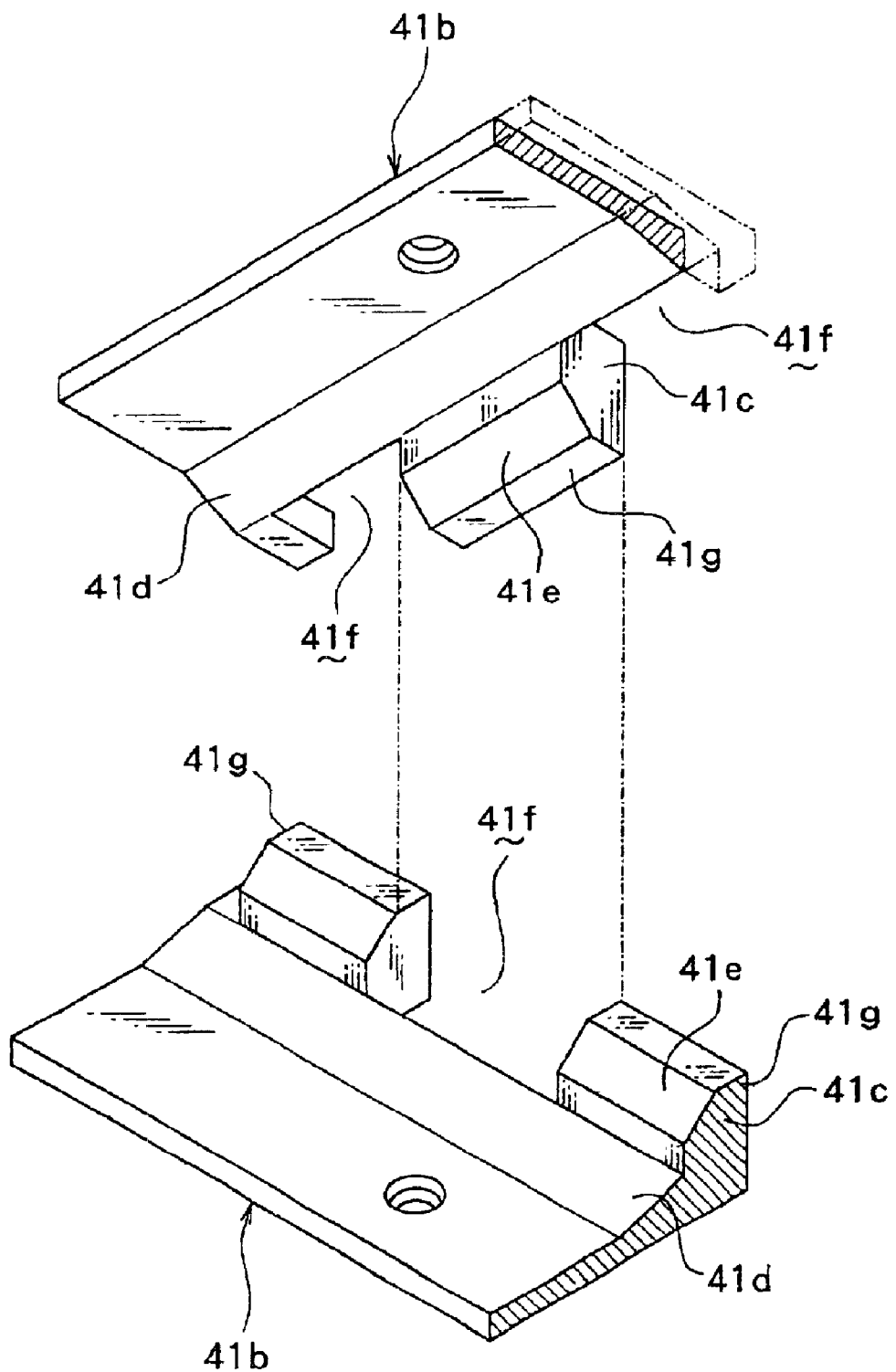
FIG. 10 shows a sectional perspective view of the supporters according to the present invention.

As shown in FIGS. 9 and 10, each supporter 41b is formed with a wafer-slide blocking wall 41c that will engage with the outer edges of each wafer W, a sloping step 41d that slops down from the lower edge of the wall 41c to the inner side of the supporter 41b, and a sloping guide face 41e that is ascending from the upper edge of the wall 41c to the outside.

Moreover, as shown in FIG. 10, each supporter 41b has at least one concave section 41f and also at least one convex section 41g. The upper supporter 41b and the lower supporter 41b engage with each other close in tight as the concave and convex sections 41f and 41g mesh with each other to hold each wafer W at its outer edges on the sloping step 41d.

The wafer W will touch the sloping step 41d with a very small contact area at the wafer outer edges, thus generation of particles being prevented. The wafer-slide blocking wall 41c formed on each supporter 41b can prevent each wafer W from being sliding to the outside for ensured wafer holding and transferring operations.

Moreover, the engagement of the concave and convex sections 41f and 41g will prevent the upper and lower holding arms 41 from sliding from each other.

The wafer-reversing unit 40 is equipped with a sensor S, as shown in FIG. 6, such as a photo sensor having a light emitting and receiving elements, for detecting a wafer W transferred into the unit 40 and held by the holding arms 41. A detection signal from the sensor S will be sent to a controller (not shown) such as a central processing unit (CPU) to give off a warning if no wafer has been detected in the wafer-reversing unit 40.

Figure 11:
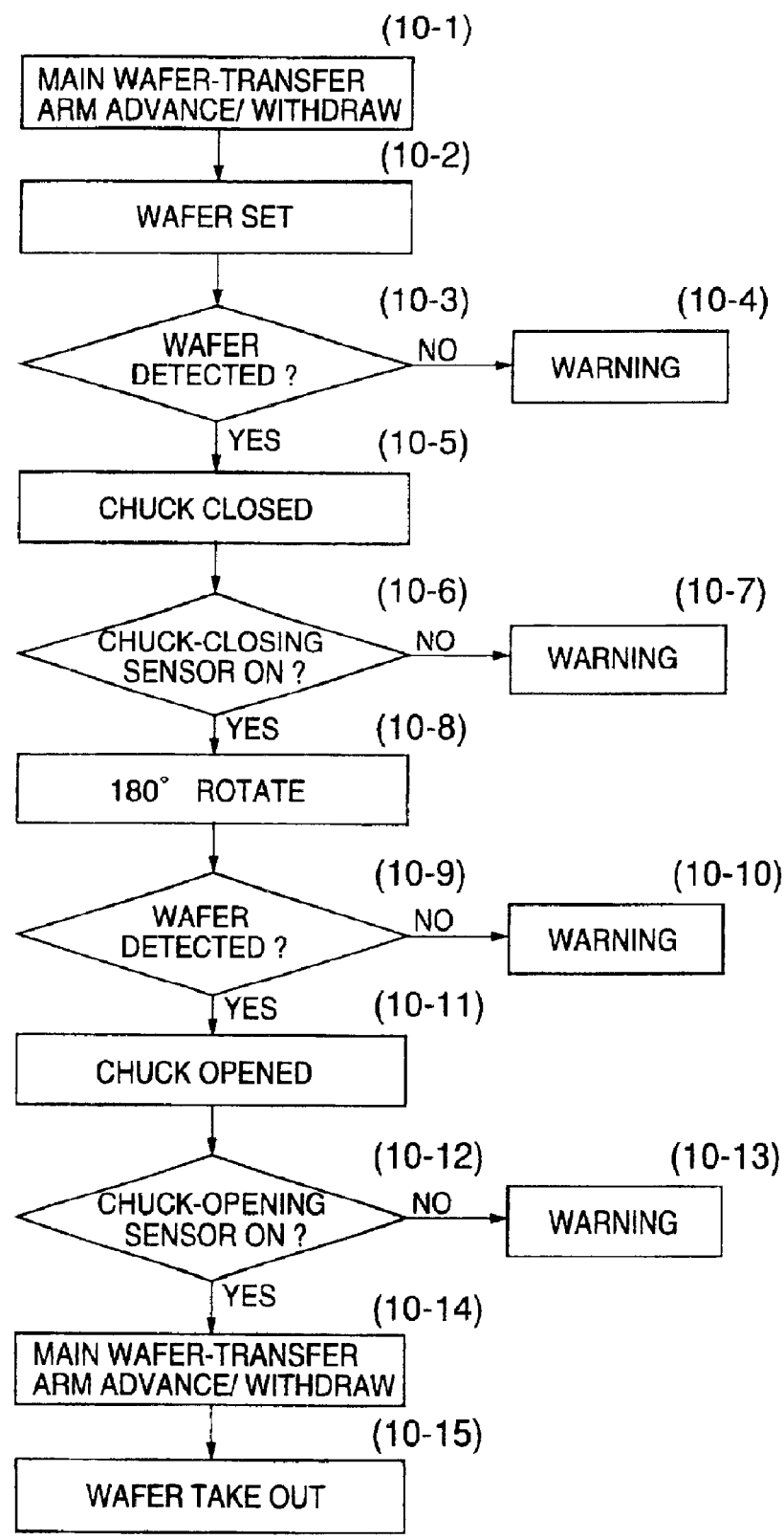
FIG. 11 shows a flowchart of wafer-reversing process for the reversing unit according to the present invention.

An operation of the wafer-reversing unit 40 will be disclosed with a flowchart shown in FIG. 11.

It is assumed that a wafer W has been cleaned for its rear surface on which no semiconductor devices have been formed.

The main wafer-transfer arm 71 advances to insert the wafer W horizontally into the wafer-reversing unit 40 as the wafer W is upside down with the rear surface at the top (step 10-1). The wafer W is set between the holding arms 41 (step 10-2). The main wafer-transfer arm 71 withdraws after the wafer W has been set.

The wafer W is detected by the sensor S (step 10-3). A warning will be giving off to an operator if no wafer has been detected (step 10-4). On detection of the wafer W, the extendable cylinder 44 of the driving mechanism 42 contracts to close the chucks 45 (step 10-5), then the holding arms 41 move close to each other to hold the wafer W therebetween. It is determined whether the chuck-closing sensor has been on (step 10-6). A warning will be giving off to the operator if chuck-closing sensor has been off to inform that no wafer has been held by the holding arms 41 (step 10-7).

On holding the wafer W, the holding arms 41 are rotated by 180 degrees around the rotary shaft 48 by the motor 43 to turn over the wafer W (step 10-8). The wafer W is now upside down with the front surface at the top on which semiconductor devices have been formed.

The wafer W is detected again by the sensor S (step 10-9). A warning will be giving off to the operator if no wafer has been detected (step 10-10). On detection of the wafer W, the extendable cylinder 44 of the driving mechanism 42 extends to open the chucks 45 (step 10-11), then the holding arms 41 move apart from each other.

It is determined whether the chuck-opening sensor has been on (step 10-12). A warning will be giving off to the operator if chuck-opening sensor has been off to inform that the wafer W has not been released from the holding arms 41 (step 10-13).

On releasing the wafer W, the main wafer-transfer arm 71 advances again to receive the wafer W placed on the lower holding arm 41 (step 10-14). The main wafer-transfer arm 71 withdraws to take out the wafer W from the wafer-reversing unit 40 (step 10-15).

The wafer W with the front surface at the top is transferred, for example, to the scrub-cleaning units 60a to 60d for front-surface cleaning.

Disclosed so far is an operation of one wafer-reversing unit 40, however, two-tiered wafer-reversing units 40 can also be adopted for different uses. For example, the lower wafer-reversing unit 40 can be used for reversing a wafer W so that its rear surface will be at the top, which has been transferred by a main wafer-transfer arm 71 of a multi-tiered main wafer-transfer arm mechanism (disclosed later) with the front surface at the top whereas the upper wafer-reversing unit 40 can be used for reversing a wafer W so that its front surface will be at the top, which has been transferred by another main wafer-transfer arm 71 of the multi-tiered main wafer-transfer arm mechanism with the rear surface at the top.

Moreover, the upper wafer-reversing unit 40 can be used for a reversing operation to a wafer W that has been cleaned by the upper cleaning units 60c and 60d among the four scrub-cleaning units 60a to 60d in the cleaning system whereas the lower wafer-reversing unit 40 can be used for a reversing operation to a wafer W that has been cleaned by the lower scrub-cleaning units 60a and 60b.

Furthermore, a wafer W to which no process has been applied, a wafer W for which the rear surface has only been cleaned, a wafer W for which the front surface has only been cleaned and a wafer W for which the front and rear surfaces have been cleaned, for example, can be randomly transferred to any wafer-reversing unit 40 available for reversing operation.

This wafer-transferring mechanism is suitable for cleaning processes applied to several wafers at different timing. These wafers can be transferred to and received from the wafer-reversing unit 40 in accordance with a processing recipe installed in a controller of the mechanical control unit 90.

There are four supporters 41b provided on each holding arm 41. The supporters 41b may, however, be at least three with the requirement that they be symmetrically arranged in relation to the axis of the rotary shaft 48 for an ensured wafer-holding operation.

Formed at the middle of the side face of each wafer-reversing unit 40 at the main wafer-transfer mechanism 70 side is an opening 72 through which one of three main wafer-transfer arms 71 of the multi-tiered main wafer-transfer arm mechanism can enter the unit 40.

Also formed at the side face of each wafer-reversing unit 40 but upper the opening 72 is a supply opening 73 through which clean air can be down flown to the unit 40 from the filter fan unit 200.

The cleaning section 10 and the interface unit 24 are separated by a partition 74 formed with drain openings 75 and a drain passage 75A connected to the openings at the lower part of the partition 74. The clean air down flown into each wafer-reversing unit 40 from the filter fan unit 200 will be flown into the drain passage 75A via the drain opening 75 and discharged to the outside through a duct (not shown) connected to the drain passage 75A.

This air-flow mechanism creates a positive pressure in each wafer-reversing unit 40 to protect the cleaning section 10 from particles sent from the interface unit 24 for high cleanliness in the cleaning section 10.

Particles which could also be generated inside the extendable cylinder 44 of the driving mechanism 42 can be discharged via ventilating equipment (not shown) connected to the cylinder 44.

Moreover, formed on each wafer-receiving unit 30 at the side face towards the main wafer-transfer mechanism 70 is a first opening 31 through which the main wafer-transfer arm 71 is allowed to enter the unit 30 and clean air from the filter fan unit 200 is allowed to be down flown into the unit 30.

Also formed on the partition 74 at the border between each wafer-receiving unit 30 and the interface unit 24 is a second opening 32 through which wafer transfer is allowed between the wafer transfer mechanism 23 and each wafer-receiving unit 30.

Provided on the bottom of are pins 33 that protrude upwards. The wafer-holding arm 23a of the wafer transfer mechanism 23 is lift up by the pins 33 while holding a wafer W and then down so that the wafer W can be placed on the pins 33.

The two-tiered wafer-receiving units 30 can be used separately. For example, the lower wafer-receiving unit 30 is available for placing only wafers W not cleaned yet and to be transferred from the interface unit 24 to the cleaning section 10 whereas the upper wafer-receiving unit 30 is available for placing only wafers W already cleaned and to be transferred from the cleaning section 10 to the interface unit 24. This arrangement protects wafers W already cleaned from particles that could attach to the pins 33 from wafers W not cleaned yet, thus decreasing wafer contamination for high wafer cleanliness.

Moreover, the two-tiered wafer-receiving units 30 can be used such that both upper and lower receiving units are used for placing wafers W not cleaned yet and to be transferred to the cleaning section 10 or for placing wafers W already cleaned and to be transferred to the interface section 24 randomly in accordance with advancements in cleaning process for high throughput and productivity.

The main wafer-transfer mechanism 70 will be disclosed further in its structure.

The main wafer-transfer mechanism 70 extends in the direction Z, having vertical walls 76a and 76b, a cylinder-like supporter 76 with a side-face opening 76c, and a wafer-transferring body 77 that can be elevated along the supporter 76 in the direction Z. The cylinder-like supporter 76 and the wafer-transferring body 77 can be rotated by a motor 78a.

The wafer-transferring body 77 is provided with a transfer base 77a and the three main wafer-transfer arms 71 slidable over the base 77a and allowed to pass through the side-face opening 76c of the cylinder-like supporter 76. Each of the three main wafer-transfer arms 71 is movable forwards and backwards independently from the other arms with a motor and a belt mechanism (both not shown).

The wafer-transferring body 77 is coupled to a drive belt 77d that runs on a drive pulley 77b attached to the shaft 48 of a motor 78b and a driven pulley 77c provided over the cylinder-like supporter 76. The drive belt 77d will be driven by the motor 78b to elevate the wafer-transferring body 77.

As shown in FIG. 4, the heating/cooling unit 50 is provided such that the main wafer-transfer mechanism 70 is interposed between the wafer-receiving unit 30 and the heating/cooling unit 50.

Installed in the heating/cooling unit 50 are one cooling unit 52 for forced cooling and three heating units 51 for forced heating and natural cooling provided over the cooling unit 52. Each unit is formed with a window 53 at the main wafer-transfer mechanism 70 side. Through the window 53, the main wafer-transfer arm 71 is allowed to enter into and withdraw from each unit.

The cooling unit 52 has a table 55 from which several pins 54 protrude to support a wafer W. Supplying a cooling gas such as nitrogen gas or a cooled water to the rear face of the table 55 achieves uniform wafer cooling.

Each heating unit 51 is equipped with a hot plate 58 with a heater 57 installed therein, to support a wafer W held over the plate very closely for uniform heating.

The heating/cooling unit 50 is mainly used for drying wafers W for which both front and rear surfaces have not completely been dried after scrub cleaning.

Figure 12:
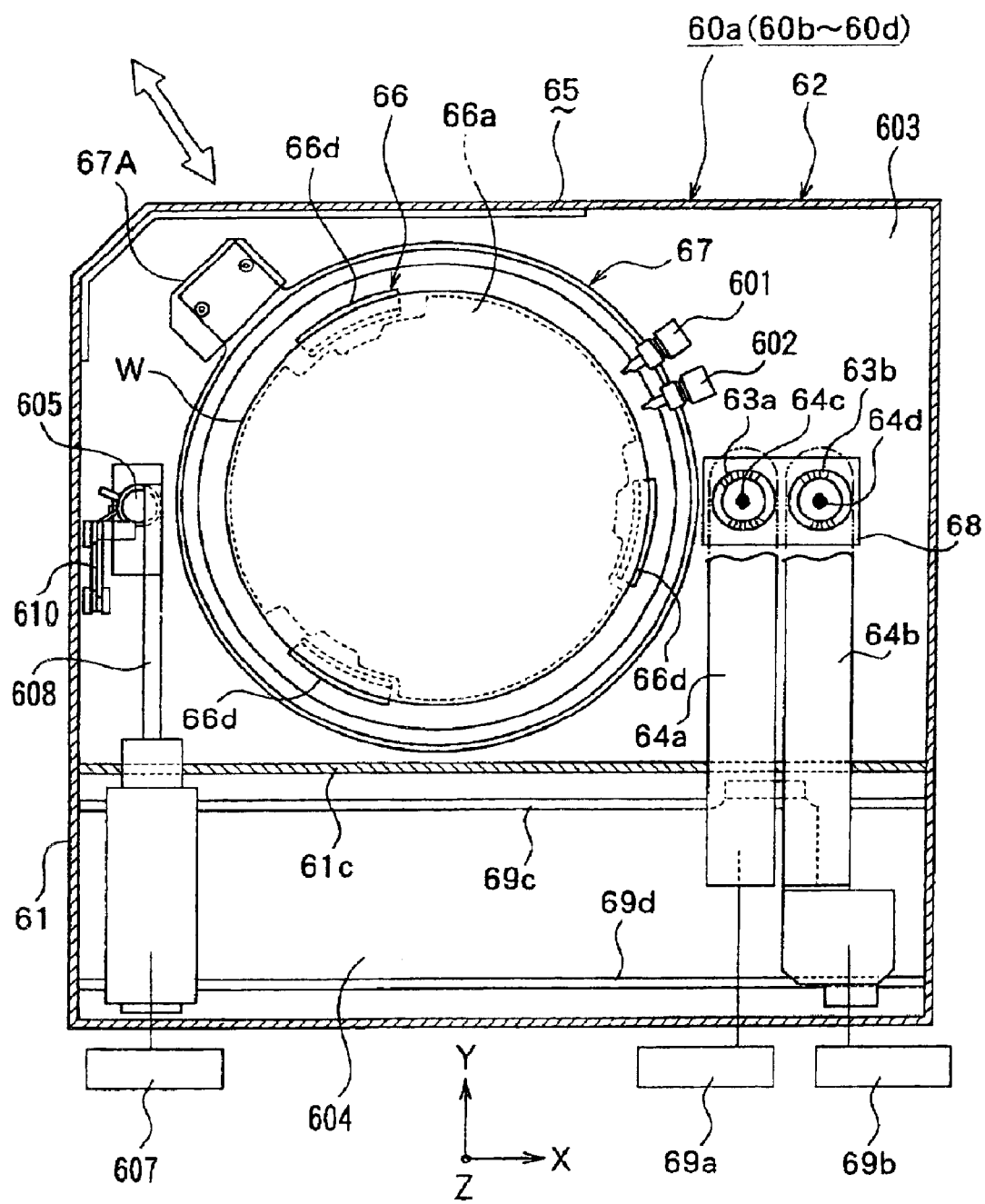
FIG. 12 shows a schematic plan view of a scrub-cleaning system as an example of the processing unit according to the present invention.
Figure 13:
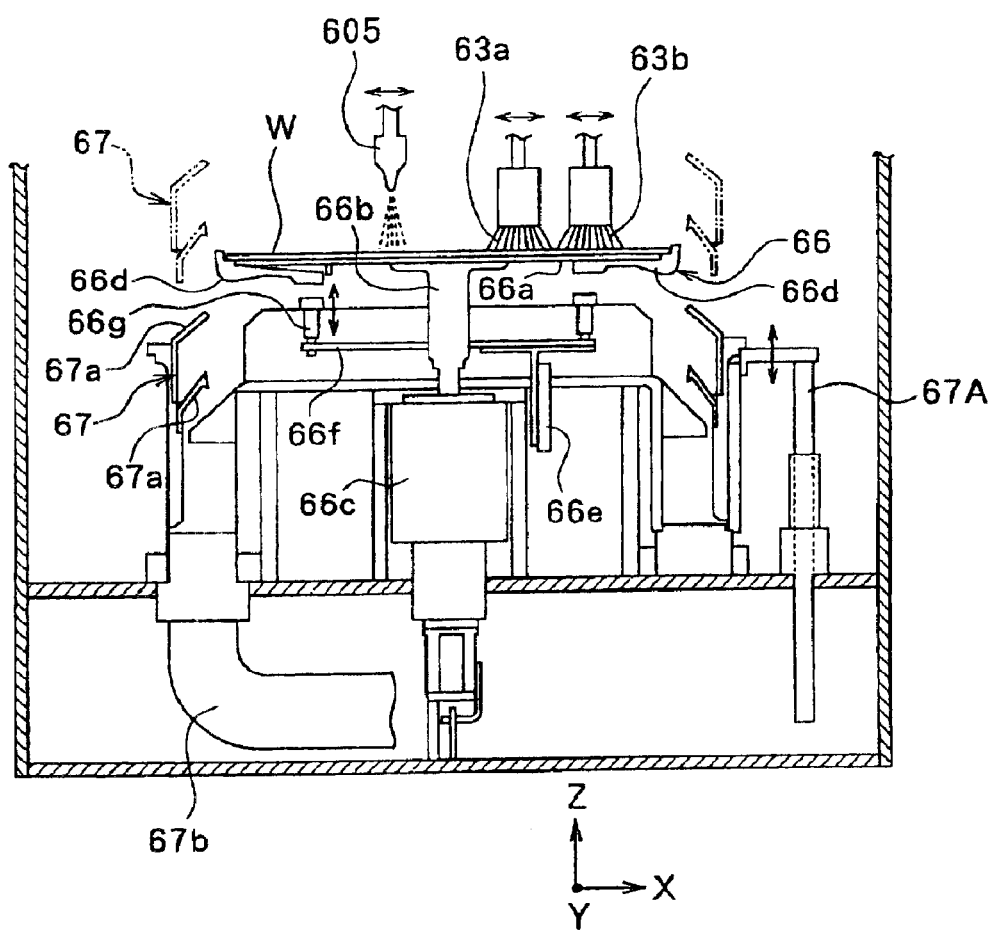
FIG. 13 shows a schematic sectional view of the scrub-cleaning system according to the present invention.

Disclosed next are the scrub-cleaning units 60a to 60d with reference to FIGS. 12 and 13.

Figure 3:
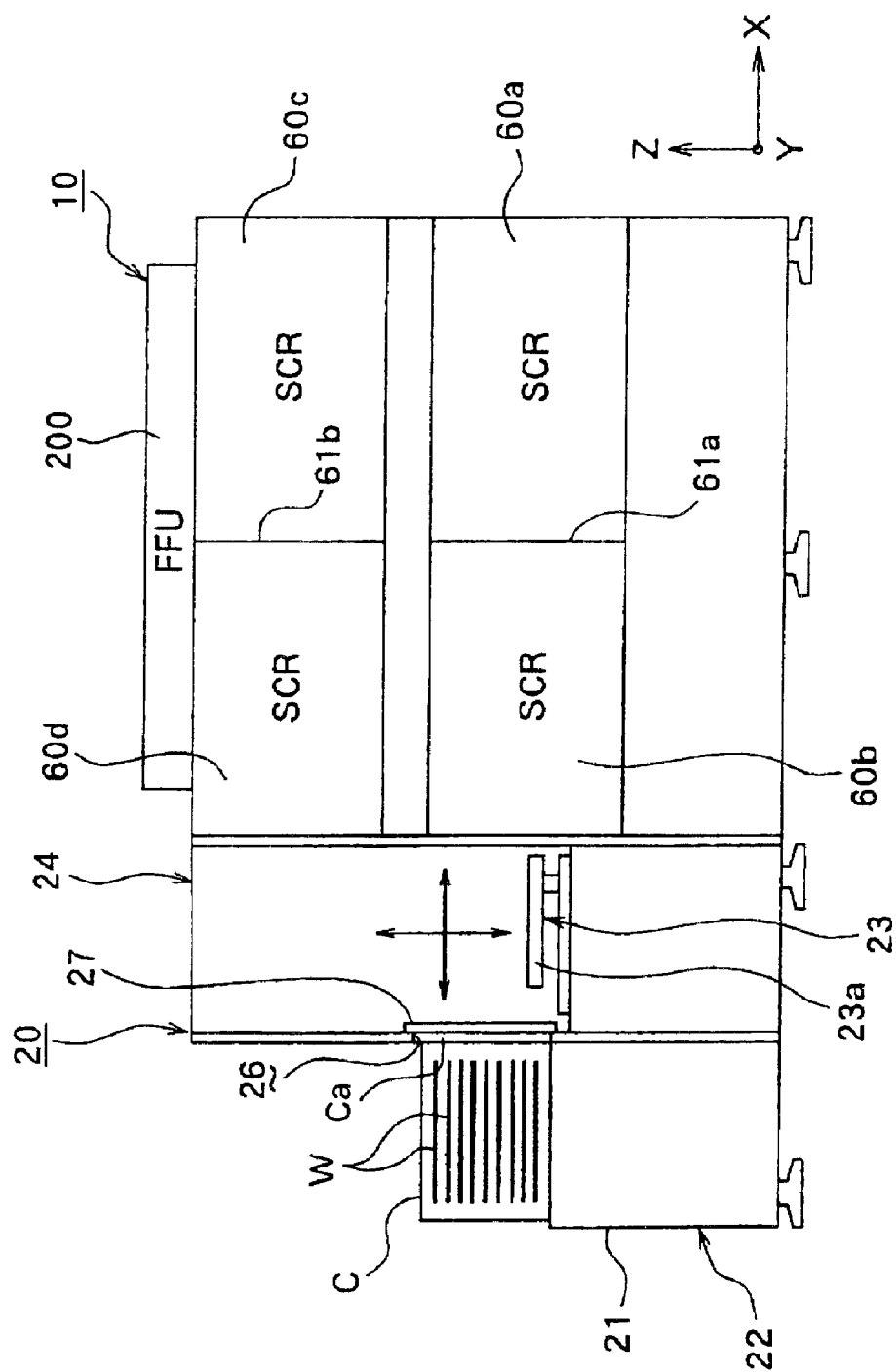
FIG. 3 shows a side view of the cleaning system in FIG. 2.

In the cleaning system shown in FIGS. 2 and 3, there are two-tiered cleaning units with two units for each stage, thus totally four scrub-cleaning units 60a to 60d being provided.

The scrub-cleaning unit 60a has a symmetrical structure at a boarder wall 61 with the scrub-cleaning unit 60b provided at the same stage for the unit 60a and the interface unit 24 side for the main wafer-transfer arm 71 to enter into and withdraw therefrom. The boarder wall 61 is a side face of a sink 62 which will be disclosed later. The scrub-cleaning unit 60c also has a symmetrical structure at the boarder wall 61 with the scrub-cleaning unit 60d provided at the same stage.

Each scrub-cleaning unit is equipped with a spin chuck 66 for supporting a wafer W almost horizontally and transferring and receiving the wafer W to and from the main wafer-transfer arm 71. The spin chuck 66 is provided as close to the main wafer-transfer mechanism 70.

Each scrub-cleaning unit is also equipped with brush-holding arms 64a and 64b that will be driven so that brushes 63a and 63b can touch the upper surface of a wafer W held in the chuck 66. The brush-holding arms 64a and 64b are provided as being apart from the main wafer-transfer mechanism 70 in a waiting mode.

The scrub-cleaning units 60a and 60b have a symmetrical structure at a boarder wall 61a, and also the scrub-cleaning units 60c and 60d have a symmetrical structure at a boarder wall 61b, as shown in FIG. 3.

The scrub-cleaning units 60a to 60d may be used for a cleaning process in which wafers W are randomly transferred to any of available cleaning units without considering whether which surface is at the top for each wafer W.

In this use, the upper scrub-cleaning units 60c and 60d can not keep high cleanliness by means of clean air supplied directly from the filter fan unit 200 provided above. On the contrary, the lower scrub-cleaning units 60a and 60b could keep such a high cleanliness compared to the upper units 60c and 60d due to supply of clean air from the filter fan unit 200 through ducts provided along the side walls of the cleaning system.

It is thus preferable that the front surface of each wafer W requiring high cleanliness is cleaned at the upper scrub-cleaning units 60c and 60d and the rear surface of the wafer W requiring not so high cleanliness is cleaned at the lower scrub-cleaning units 60a and 60b.

In the scrub-cleaning units 60a and 60b for rear-surface cleaning, a wafer W will be upside down or the front surface will be at the bottom when held on the spin chuck 66 horizontally. Therefore, a mechanical chuck for mechanically holding wafer edges is preferably used as the spin chuck 66 for causing no damages to the wafer front surface.

On the contrary, in the scrub-cleaning units 60c and 60d for front-surface cleaning, the rear surface of a wafer W will be at the bottom when held on the spin chuck 66 horizontally. Therefore, a vacuum-type chuck for holding the wafer W by vacuum suction is preferably used as the spin chuck 66.

The scrub-cleaning units 60a to 60d are different in structure of the spin chuck 66 only when the units 60c and 60d are used for front-surface cleaning and the units 60a and 60b are used for rear-surface cleaning.

Therefore, the scrub-cleaning unit 60a for rear-surface cleaning only will be disclosed in detail with reference to FIGS. 12 and 13.

All components of the scrub-cleaning unit 60a are installed in the sink 62. A shutter window 65 is provided on the border between the sink 62 and the main wafer-transfer mechanism 70. The spin chuck 66 is provided near the main wafer-transfer mechanism 70 so that the main wafer-transfer arm 71 can enter into and withdraw from the scrub-cleaning unit 60a through the shutter window 65.

The spin chuck 66 mainly consists of a chuck plate 66a, a support column 66b for supporting the chuck plate 66a, and a rotary mechanism 66c for rotating the support column 66b.

Several support pins (not shown) are fixed on the chuck plate 66a for supporting a wafer W on the tip of each pin. Also provided on the chuck plate 66a at the outer edges are three wafer-detaching mechanisms 66d. Shown in FIG. 13 are the left-side wafer-detaching mechanism 66d that has supported a wafer W and the right-side wafer-detaching mechanism 66d that has not supported the wafer W.

Attached on a table 66f are three poles 66g at the positions corresponding to the locations of the three wafer-detaching mechanisms 66d. The poles 66g press the inner edges of the corresponding wafer-detaching mechanisms 66d to the rear surface of the chuck plate 66a when the table 66f has been lifted up by an elevating mechanism 66e. This action forces the outer edge of each wafer-detaching mechanism 66d to be inclined outwards to release the wafer W from each mechanism 66d. When the table 66f is lifted down, the poles 66g are separated from the wafer-detaching mechanisms 66d, thus the outer edges of the mechanisms 66d being raised to hold the wafer W.

The chuck plate 66a is surrounded by a cup 67 which can be lifted up by an elevating mechanism 67A. FIG. 13 shows an upper position a lower position of the cup 67, indicated by a dot line and a solid line, respectively.

The cup 67 will be located at the lower position during wafer transfer whereas located at the upper position during wafer cleaning so that a cleaning liquid scattering from the wafer edges can be dropped in the cup 67. Upper and lower tapers 67a formed on the cup 67 will prevent the cleaning liquid from being scattered to the outside while the cup 67 is located at the upper position for wafer cleaning. A drain 67b is connected to the cup 67 at the inner side-bottom section for air ventilation and cleaning-liquid draining.

The two brushes 63a and 63b are attached to the tips of the brush-holding arms 64a and 64b, respectively, for scrub cleaning while they are touching the upper surface of a wafer W. In detail, the brushes 64a and 64b are rotated, by rotary mechanisms (not shown) also provided at the tips of the brush-holding arms 63a and 63b, about rotary axes 64c and 64d, respectively, during the scrub cleaning. The rotary axes 64c and 64d are in parallel in the direction Z.

In FIG. 12, the brush-holding arms 64a and 64b are located outside the cup 67 in a waiting mode. In detail, the two arms are located over a brush bus 68 in the waiting mode to catch the cleaning liquid which could be dripped from the brushes 63a and 63b.

Cleaning-liquid supply nozzles (not shown) are provided at the tips of the brush-holding arms 64a and 64b, for supplying a specific amount of cleaning liquid to the brushes 63a and 63b during scrub cleaning.

The brush-holding arm 64a is connected at its end to a drive mechanism 69a so that it can slide along a guide 69c in the direction X. Moreover, the brush-holding arm 64b is connected at its end to a drive mechanism 69b so that it can slide along a guide 69d in the direction X.

Not only driven independently, the two brush-holding arms 64a and 64b can be lifted up in the direction Z by elevating mechanisms (not shown) of the drive mechanisms 69a and 69b for height adjustments. Other elevating mechanisms may be provided at the tips of the brush-holding arms 64a and 64b for lifting up the brushes 63a and 63b in the direction Z.

In operation of the scrub-cleaning unit 60a as disclosed above, cleaning liquids are supplied at specific positions of the upper surface of a wafer W from rinse nozzles 601 and 602 provided outside but near the cup 67, to form a uniform film of cleaning liquid while the brush-holding arms 64a and 64b are driven simultaneously to make the brushes 63a and 63b touch the wafer W on different positions and move the brushes in the direction X. This operation will shorten a cleaning time for each wafer W.

The brushes 63a and 63b may be made of different materials for their tips that will touch wafers W. One material may be used for rough cleaning and the other may be for finishing for more delicate cleaning. Moreover, one of the brushes 63a and 63b may be used as an alternative in case the other brush usually used is out of use due to malfunction or abrasion.

In FIG. 12, the sink 62 is divided by a wall 61c into a cleaning chamber 603 in which the cup 67 is installed and a drive-mechanism chamber 604 in which the drive mechanisms 69a and 69b are installed, even though these mechanisms being shown outside.

The brush-holding arms 64a and 64b to be driven by the drive mechanisms 69a and 69b are arranged such that their tips are located within the cleaning chamber 603 through an opening (not shown) formed on the wall 61c. In detail, the opening is formed in the direction X with a specific width in the direction Z so that no problems will occur to the movement of the brush-holding arms 64a and 64b in the directions X and Z.

The partition of the sink 62 into the two chambers 603 and 604 prevents scattering of particles, etc., which could occur while the drive mechanisms 69a and 69b are running and hence protects wafers W from attachment of particles. This sink partition also protects the drive mechanisms 69a and 69b from malfunctions which may otherwise occur when the cleaning liquids scattered outside the cup 67 are attached to these brush-holding arms 64a and 64b.

The scrub-cleaning unit 60a is also equipped with a rinse-liquid drain nozzle 605 for a cleaning process with high-speed jet washing or ultrasound washing instead of scrub cleaning using the brushes 63a and 63b. The drain nozzle 605 is attached to the tip of a nozzle-holding arm 608 that is movable along the guide 69c in the directions X and also can be lifted up in the direction Z by a drive mechanism 607. The drain nozzle 605 can be adjusted for its height in the direction Z and angle of discharging a rinse liquid by a height/angle adjustment mechanism 610.

The scrub-cleaning unit 60a equipped with the two types of cleaning mechanisms as disclosed above is available for several types of cleaning in accordance with wafer types. For example, scrub cleaning may only be performed, or high-speed jet washing or ultrasound washing may be performed before or after the scrub cleaning.

The drive mechanism 607 is installed in the drive-mechanism chamber 604, even though it is shown outside in FIG. 12.

Like the brush-holding arms 64a and 64b, the nozzle-holding arm 608 is provided such that its tip is located within the cleaning chamber 603 through an opening (not shown) formed on the wall 61c.

This arrangement prevents scattering of particles, which will occur while the drive mechanism 607 is running, into the cleaning chamber 603. It also protects the drive mechanism 607 from malfunctions which may otherwise occur when the cleaning liquids scattered outside the cup 67 are attached to this mechanism in the drive-mechanism chamber 604.

Disclosed next is wafer-cleaning process in the cleaning system described above under a processing recipe for wafer front-surface cleaning and rear-surface cleaning to be performed sequentially in this order.

This sequential wafer-cleaning process is performed under the following requirements:

The lower wafer-receiving unit 30 is used for transferring wafers W from the interface unit 24 to the cleaning section 10 whereas the upper wafer-receiving unit 30 is used for transferring wafers W from the cleaning section 10 to the interface unit 24.

The lower wafer-reversing unit 40 is used for reversing wafers W so that the front surface will be at the bottom, or the rear surface will be at the top whereas the upper wafer-reversing unit 40 is used for reversing wafers W so that the front surface will be at the top, or the rear surface will be at the bottom for each wafer.

The lower scrub-cleaning units 60a and 60b are used for rear-surface cleaning whereas the upper scrub-cleaning units 60c and 60d are used for front-surface cleaning for each wafer.

The three main wafer-transfer arms 71 are controlled under a processing recipe preinstalled in a controller of the mechanical board unit 90 for transferring wafers W among the units 30, 40 and 60a to 60d for which the roles are decided as above.

In operation, a carrier C containing a specific number of wafers W is placed on the table 21 at the interface unit 24 side in FIG. 2.

The window 26 is opened by the window-shutting mechanism 27 and also the cover Ca is opened if formed at the carrier C so that the wafers W contained in the carrier C can be exposed to the interface unit 24.

The mapping sensor detects conditions of the wafers W contained in the carrier C. If an abnormal condition is detected, the process for this carrier C is interrupted and another carrier C is set ready.

If no abnormal condition is detected, the wafer-holding arm 23a of the wafer transfer mechanism 23 enters the carrier C at a specific height to pick up one wafer W. The wafer W is then transferred to the lower wafer-receiving unit 30 and placed in the unit at a specific position with the front surface of the wafer W being at the top. The wafer transfer mechanism 23 continues a transfer operation for the next wafer W.

One of the main wafer-transfer arms 71 of the main wafer-transfer mechanism 70, for example, the uppermost transfer arm 71 enters the lower wafer-receiving unit 30 to take out the wafer W.

The main wafer-transfer arm 71 transfers the wafer W with the front surface at the top to either the upper scrub-cleaning unit 60c or 60d.

In the upper scrub-cleaning unit 60c, for example, the shutter window 65 is opened while the cup 67 is located at the lower position indicated by the solid line in FIG. 13. The main wafer-transfer arm 71 enters at the position of the spin chuck 66 to place the wafer W thereon. Then, the main wafer-transfer arm 71 withdraws from the scrub-cleaning unit 60c.

The spin chuck 66 is preferably a vacuum-sucking mechanism for holding the wafer W by vacuum suction. The wafer W will, however, bear marks of vacuum suction on its rear surface while being sucked. The marks will be removed later by rear-surface cleaning by the scrub-cleaning units 60a and 60b.

The brush-holding arms 64a and 64b traverse over the wafer W so that the brushes 63a and 63b will be located just above the wafer W. The cup 67 is raised to the upper position indicated by the dot line in FIG. 13. Cleaning liquids are sprayed on the wafer W from the rinse nozzles 601 and 602 to form a film of cleaning liquid while the wafer W is being rotated by the spin chuck 66.

Then, the brushes 63a and 63b rotate and touch the wafer W while the cleaning liquids have been sprayed, and the brush-holding arms 64a and 64b traverse over the wafer W at a specific speed for scrub cleaning.

In detail, the brush-holding arms 64a and 64b traverse over the wafer W in the direction X at a high speed over the wafer center area whereas at a low speed over the wafer outer area due to a low peripheral velocity for the wafer W at the center area whereas a high peripheral velocity at the outer area while rotating. This speed control offers an almost same contact time for the brushes 63a and 63b to touch the wafer W over the entire wafer surface, thus achieving a uniform cleaning process over the entire wafer surface.

When the scrub cleaning using the brushes 63a and 63b has been completed, the brushes are withdrawn from the cup 67 and placed over the brush bus 68.

The nozzle-holding arm 608 then enters the cup 67 for spraying a cleaning liquid from the rinse-liquid drain nozzle 605 for high-speed jet washing or ultrasound washing onto the rotating wafer W while traversing over the wafer W in the direction X.

Either the scrub cleaning with the brushes 63a and 63b or the high-speed jet (or ultrasound) washing with the rinse-liquid drain nozzle 605 only may be performed.

After the completion of cleaning process, the nozzle-holding arm 608 is withdrawn from the cup 67, followed by spin drying in which the wafer W is rotated further at a specific speed to remove the cleaning liquid from the wafer W. It is preferable before the spin drying to spray rinse liquids from the rinse nozzles 601 and 602 on the rotating wafer W for rense process.

The cup 67 is lifted down to the lower position and the spin chuck 66 is released from vacuum suction after the spin drying. The shutter window 65 is opened to accept the main wafer-transfer arm 71 to enter the scrub-cleaning unit 60c.

The main wafer-transfer arm 71 transfers the surface-cleaned wafer W to the heating/cooling unit 50 for wafer cooing by the cooling unit 52.

The cooled wafer W is transferred by the main wafer-transfer arm 71 to the lower wafer-reversing unit 40 for the wafer W to be upside down, or to have the rear surface at the top.

The wafer W is then inserted between the pair of wafer-holing arms 41 and placed on the supporters 41b of the lower holding arm 41. The cylinder 44 of the driving mechanism 42 contracts to make the upper and lower holding arms 41 to have a close mechanical contact with each other to hold the wafer W. The main wafer-transfer arm 71 may be withdrawn after the wafer holding. Stepped guides 51h (FIG. 8) formed on the holding arms 41 prevent interference between the arms and the main wafer-transfer arm 71.

When the wafer W is detected by the sensor S while being held by the wafer-holding arms 41, the motor 43 rotates about the rotary axis 48 by 180 degrees to reverse the wafer W so that the rear surface will be at the top.

The wafer W with the rear surface at the top is detected again by the sensor S. The cylinder 44 of the driving mechanism 42 extends to make the upper and lower holding arms 41a and 41b to be separated from each other so that the wafer W with the rear surface at the top will be placed on the supporters 41b of the lower holding arm 41.

The wafer W is detected again by the sensor S and released from the wafer-holding arms 41. The main wafer-transfer arm 71 enters the wafer-reversing unit 40 to receive the wafer W. The main wafer-transfer arm 71 may enter the unit 40 and set on the stepped guides 41h of the wafer-holding arms 41 to receive the wafer W while the wafer is being held by the holding arms.

After the reversed wafer W has been picked up by the main wafer-transfer arm 71, the wafer-holding arms 41 may wait for transfer of the next wafer to be reversed. Or, it may be rotated by 180 degrees for receiving wafers before being reversed so that wafers will be always placed on the same supporters 41b.

The receipt of wafers after the main wafer-transfer arm 71 has been rotated as above decreases the number of actions of this arm for high throughput. Moreover, the receipt of wafers always on the same supporters 41b, for example, placing wafers with the rear surface at the bottom on the same supporters 41b, prevents the wafers from attachment of particles on the front surface.

The main wafer-transfer arm 71 transfers the wafer W with the rear surface at the top to either the scrub-cleaning unit 60a or 60b for scrub cleaning like the scrub-cleaning unit 60c described above.

The wafer W for which cleaning process to both front and rear surfaces and drying process have been completed requires to be reversed before being brought back to the carrier C because the rear surface has been at the top.

The wafer W is then transferred to the upper wafer-reversing unit 40 by the main wafer-transfer arm 71 for wafer reversion like the lower wafer-reversing unit 40 described above. The wafer W with the front surface at the top is brought back to the main wafer-transfer arm 71.

The wafer W is then transferred to the upper wafer-receiving unit 30a by the main wafer-transfer arm 71, further to the interface unit 24 by the wafer-holding are 23a, and brought back to the carrier C by the wafer transfer mechanism 23.

When all wafers W have been brought back to the carrier C, the carrier C is transferred to another process.

The same main-wafer transfer arm 71 is used for wafer transfer in the above disclosure, however, any one of the three arms 71 can be used depending on conditions.

In the foregoing disclosure, the cleaning system in which the substrate dual-side processing apparatus according to the present invention is installed is used for cleaning semiconductors. The cleaning system can, however, be used for cleaning LCD substrates and CD substrates, for example. Moreover, the substrate dual-side processing apparatus according to the present invention can be used for any process to both sides of substrates other than cleaning.

As disclosed above, the present invention has the following advantages:

(1) A substrate dual-side processing apparatus according to the present invention has a processor to apply a specific process to a front surface and a rear surface of a substrate, a reversing unit to reverse the substrate; and a substrate-transfer mechanism to transfer the substrate between the processor and the reversing unit, wherein the reversing unit has a holder for holding the substrate when the substrate is being transferred to and from the substrate-transfer mechanism and a rotating mechanism for rotating the substrate, thus the substrate being reversed while held by the holders.

This substrate dual-side processing apparatus performs substrate transfer and reversion only by the holder and the rotating mechanism.

Thus, the present invention offers compactness to the substrate dual-side processing apparatus, and achieves substrate-transfer and -reversion operations with an ensured wafer-holding operation for high throughput.

(2) Moreover, a substrate dual-side processing apparatus according to the present invention has a processor to apply a specific process to a front surface and a rear surface of a substrate, a reversing unit to reverse the substrate and a substrate-transfer mechanism to transfer the substrate between the processor and the reversing unit, wherein the reversing unit has a pair of holders for holding the substrate at the front and rear surfaces, a drive mechanism for driving the pair of holders so that the holders become close to or apart from each other and a rotating mechanism for rotating the substrate, thus substrate being reversed while held by the holders.

This substrate dual-side processing apparatus performs substrate transfer and reversion only by the drive mechanism and the rotating mechanism.

Thus, the present invention also offers compactness to the substrate dual-side processing apparatus, and achieves substrate-transfer and -reversion operations with an ensured wafer-holding operation for high throughput.

(3) The drive mechanism may have an extendable cylinder and a coupler for coupling the pair of holders and the extendable cylinder at both ends so that the holders are movable by a specific same distance in relation to the substrate transferred to the reversing unit.

In addition to the advantage (2), the present invention achieves an ensured and speedy wafer holding operation and offers almost the same position for every substrate in transfer between the inverting unit and the substrate-transfer mechanism before and after inversion.

(4) Each holder may have at least three supporters for supporting substrate edges when the substrate is held by the holders.

In addition to the advantages (2) and (3), the present invention thus achieves an ensured and speedy wafer holding operation. Arrangements of the supporters as symmetrical in relation to a rotary axis of the rotating mechanism offers a further ensured wafer holding operation.

(5) Each supporter may have a wafer-slide blocking wall to engage with the substrate edges, a sloping step sloping down from a lower edge of the wafer-slide blocking wall to an inner side of each supporter and a sloping guide face ascending from an upper edge of the wafer-slide blocking wall to outside.

This structure achieves decrease in contact area for the substrate only at the edges while the substrate is transferred to each supporter.

In addition to the advantage (4), the present invention thus achieves decrease in contact area between the substrate and each supporter, thus generation of particles being prevented.

Moreover, the wafer-slide blocking wall prevents the substrate from being sliding to the outside for ensured wafer holding and transferring operations.

(5) Furthermore, each supporter may have at least one concave section and at least one convex section that will mesh with each other while the holders are becoming close to each other.

In addition to the advantages (4) and (5), the present invention restricts relative movements of the holders, thus achieving a further ensured wafer holding operation.

What is claimed is:

1. A substrate dual-side processing apparatus comprising:
   a processor to apply a specific process to a front surface and a rear surface of a substrate;
   a reversing unit to reverse the substrate; and
   a substrate-transfer mechanism to transfer the substrate between the processor and the reversing unit.
   wherein the reversing unit has a pair of holders for holding the substrate at the front and rear surfaces, a drive mechanism for driving the pair of holders so that the holders become close to or apart from each other, and a rotating mechanism for rotating the substrate, thus the substrate being reversed while held by the holders,
   wherein each of the pair of holders has at least three supporters for supporting substrate edges when the substrate is held by the holders, and
   wherein each of the three supporters has a wafer-slide blocking wall to engage with the substrate edges, a sloping step sloping down from a lower edge of the wafer-slide blocking wall to an inner side of each supporter and a sloping guide face ascending from an upper edge of the wafer-slide blocking wall to outside.

2. A substrate dual-side processing apparatus comprising:
   a processor to apply a specific process to a front surface and a rear surface of a substrate;
   a reversing unit to reverse the substrate; and
   a substrate-transfer mechanism to transfer the substrate between the processor and the reversing unit,
   wherein the reversing unit has a pair of holders for holding the substrate at the front and rear surfaces, a drive mechanism for driving the pair of holders so that the holders become close to or apart from each other, and a rotating mechanism for rotating the substrate, thus the substrate being reversed while held by the holders,
   wherein each of the pair of holders has at least three supporters for supporting substrate edges when the substrate is held by the holders, and
   wherein each of the three supporters has at least one concave section and at least one convex section, the concave and convex sections meshing with each other while the holders are becoming close to each other.

3. The substrate dual-side processing apparatus according to claim 1 or 2, wherein the drive mechanism has an extendable cylinder and a coupler for coupling the pair of holders and the extendable cylinder at both ends, the holders being movable by a specific same distance in relation to the substrate transferred to the reversing unit.

4. The substrate dual-side processing apparatus according to claim 1 or 2, wherein the three supporters are arranged symmetrically in relation to a rotary axis of the rotating mechanism.

5. The substrate dual-side processing apparatus according to claim 1 or 2, wherein the processor applies a cleaning process to the front and rear surface of the substrate.

* * * * *